United States Patent
Kobayashi

(10) Patent No.: US 9,147,591 B2
(45) Date of Patent: Sep. 29, 2015

(54) SUBSTRATE PROCESSING APPARATUS

(75) Inventor: Sensho Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 134 days.

(21) Appl. No.: 14/004,953

(22) PCT Filed: Mar. 23, 2012

(86) PCT No.: PCT/JP2012/057578
§ 371 (c)(1),
(2), (4) Date: Sep. 13, 2013

(87) PCT Pub. No.: WO2012/133218
PCT Pub. Date: Oct. 4, 2012

(65) Prior Publication Data
US 2014/0003891 A1    Jan. 2, 2014

(30) Foreign Application Priority Data
Mar. 26, 2011   (JP) .................................. 2011-069016

(51) Int. Cl.
*H01L 21/67* (2006.01)
*H01L 21/677* (2006.01)

(52) U.S. Cl.
CPC .... *H01L 21/67703* (2013.01); *H01L 21/67173* (2013.01); *H01L 21/67184* (2013.01); *H01L 21/67201* (2013.01)

(58) Field of Classification Search
CPC ................... H01L 21/67173; H01L 21/67201; H01L 21/67184; H01L 21/67703
See application file for complete search history.

(56) References Cited

U.S. PATENT DOCUMENTS

| 4,764,076 | A  | * | 8/1988  | Layman et al. ............... 414/217 |
|-----------|----|---|---------|--------------------------------------|
| 6,168,667 | B1 | * | 1/2001  | Yoshioka ...................... 118/715 |
| 6,382,895 | B1 | * | 5/2002  | Konishi et al. ................ 414/217 |
| 8,545,118 | B2 | * | 10/2013 | Ogura et al. ................... 396/611 |
| 8,851,008 | B2 | * | 10/2014 | Fukutomi et al. ............... 118/64 |
| 2005/0005849 | A1 | * | 1/2005  | Masuoka ...................... 118/719 |
| 2006/0245852 | A1 | * | 11/2006 | Iwabuchi ...................... 414/217 |
| 2011/0062113 | A1 | * | 3/2011  | Hiroki ............................ 216/58 |
| 2011/0238201 | A1 | * | 9/2011  | Hiroki .......................... 700/112 |
| 2013/0039734 | A1 | * | 2/2013  | Englhardt et al. ............ 414/806 |
| 2013/0302115 | A1 | * | 11/2013 | Wakabayashi et al. ....... 414/217 |

(Continued)

FOREIGN PATENT DOCUMENTS

JP   2004-349503   12/2004
JP   2007-149973   6/2007

(Continued)

*Primary Examiner* — Kaitlin Joerger
(74) *Attorney, Agent, or Firm* — IPUSA, PLLC

(57) ABSTRACT

A substrate processing apparatus includes a plurality of vacuum transfer modules including transfer mechanisms for transferring a substrate between a plurality of process modules arranged near the vacuum transfer modules that are configured to process the substrate under a reduced-pressure atmosphere; one or more load lock modules provided at each of the vacuum transfer modules; a first atmosphere transfer mechanism that transfers the substrate that is fed from outside to one load lock module; and a second atmosphere transfer mechanism that receives the substrate from the first atmosphere transfer mechanism and transfers the received substrate to another load lock module. The second atmosphere transfer mechanism is arranged above or below the vacuum transfer module that is provided with the one load lock module, and the vacuum transfer modules are arranged in series along a substrate transfer direction of the second atmosphere transfer mechanism.

6 Claims, 7 Drawing Sheets

(56) References Cited

U.S. PATENT DOCUMENTS

2013/0309045 A1* 11/2013 Kobayashi .................... 414/217
2014/0154887 A1* 6/2014 Trivedi et al. ................. 438/703
2014/0161983 A1* 6/2014 Inagaki ......................... 427/402

FOREIGN PATENT DOCUMENTS

| JP | 2009-260087 | 11/2009 |
|----|-------------|---------|
| WO | WO 2008/129617 | 10/2008 |

* cited by examiner

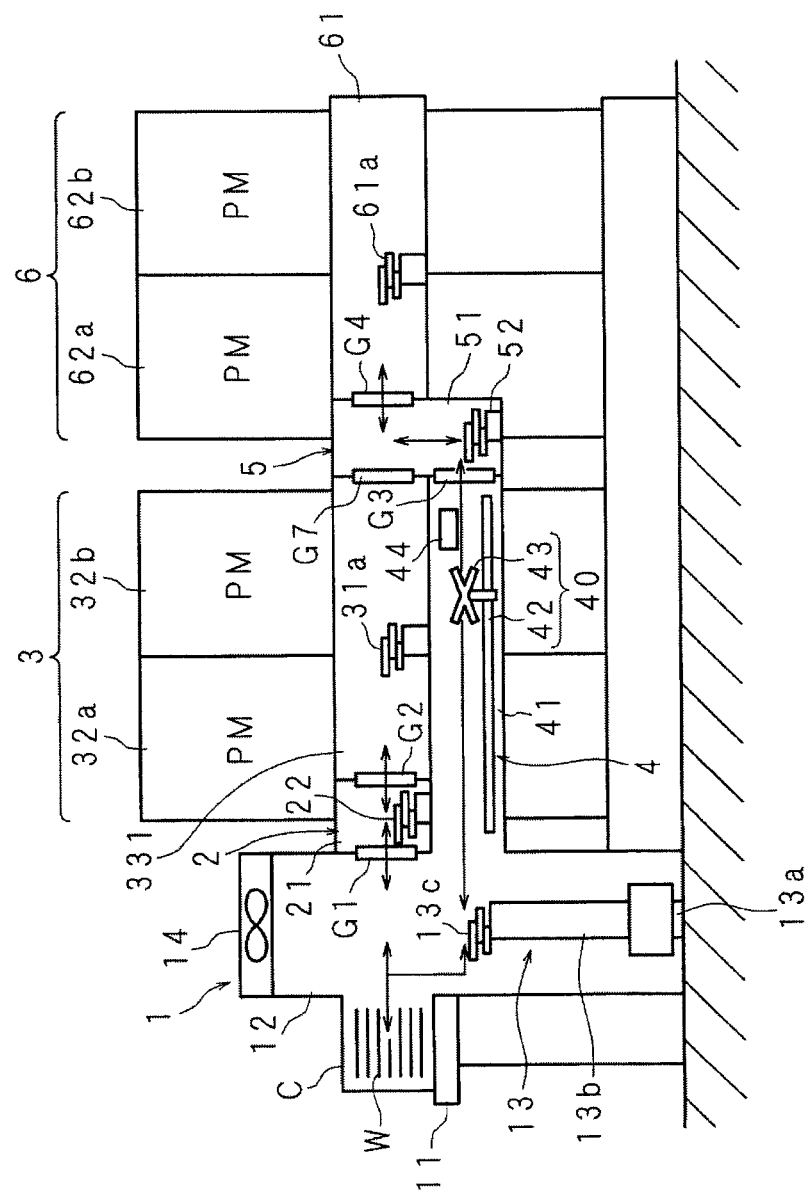

SUBSTRATE PROCESSING APPARATUS

TECHNICAL FIELD

The present invention relates to a multi-chamber substrate processing apparatus including a plurality of process modules that are configured to process a substrate under a reduced-pressure atmosphere.

BACKGROUND ART

Multi-chamber substrate processing apparatuses are known that have multiple vacuum processing devices arranged near a vacuum transfer module, the vacuum processing devices being configured to perform various substrate processes on a semiconductor wafer, such as film formation, etching, oxide diffusion, annealing, or modification. The multi-chamber processing apparatus is configured to successively perform requisite substrate processes on a wafer by transferring the wafer between the vacuum process modules via the vacuum transfer chamber. By clustering plural vacuum processing devices in this manner, the substrate processing throughput may be improved.

Patent Document 1 discloses a tandem-type substrate processing apparatus in which two clustered multi-chamber devices are connected in series via a gate valve, and a relay chamber is provided for transferring a wafer between vacuum transfer modules of first and second clusters. The first cluster includes a load lock module, and a wafer is transferred to the vacuum transfer module of the first cluster via the load lock module. The wafer transferred to the vacuum transfer module of the first cluster successively undergoes a number of substrate processes at vacuum process modules of the first cluster. When the substrate processes at the first cluster are completed, the wafer is transferred to the second cluster via the relay chamber. At the second cluster, a number of substrate processes are successively conducted on the wafer in a manner similar to the first cluster. When the substrate processes are completed, the processed wafer follows the same path in reverse order to be discharged.

Patent Document 2 discloses a substrate processing apparatus in which only vacuum process modules that require a substrate to be passed under a reduced-pressure atmosphere are connected to a vacuum transfer module to form one cluster, and vacuum process modules that are allowed to pass a substrate to/from each other under air atmosphere are each connected to an atmosphere transfer module via load lock modules. Patent Document 2 also discloses a substrate processing apparatus in which two clusters are arranged in parallel along a wafer transfer direction of an atmosphere transfer mechanism and a wafer supplied from outside is transferred to the load lock modules of the clusters.

PRIOR ART DOCUMENTS

Patent Documents

Patent Document 1: Japanese Laid-Open Patent Publication No. No. 2004-349503
Patent Document 2: Japanese Laid-Open Patent Publication No. 2007-149973

SUMMARY OF THE INVENTION

Problem to be Solved by the Invention

However, in the substrate processing apparatus of Patent Document 1, wafer transfer throughput is degraded because the wafer has to be transferred via the load lock modules and clusters. When a vacuum transfer mechanism is rate-controlled, the substrate processing throughput may not be improved even when clusters are increased.

Also, in the substrate processing apparatus of Patent Document 1, when failure occurs at a vacuum transfer module arranged upstream of a load lock module, substrate processing operations cannot be continued even if the downstream side cluster is able to operate normally.

Also, in the substrate processing apparatus of Patent Document 2, two clusters are arranged in parallel along the wafer transfer direction of the atmosphere transfer mechanism for transferring a wafer supplied via a load port to the load lock modules of the clusters. With such a configuration, the dimension of the atmosphere transfer mechanism in its transfer direction is increased. When the dimension of the atmosphere transfer mechanism is increased, the throughput of the atmosphere transfer mechanism may be decreased.

Also, in the substrate processing apparatus of Patent Document 2, the atmosphere transfer mechanism passes a wafer to/from the clusters directly via the load lock chambers. Thus, when plural load lock chambers are required to pass wafers at the same time, the atmosphere transfer mechanism cannot perform transfer operations for transferring wafers to each of the load lock chambers at the same time so that throughput may be degraded.

The present invention has been conceived in view of the foregoing problems associated with the prior art, and it is an object of the present invention to provide a substrate processing apparatus that is capable of reducing the space occupied by the substrate processing apparatus, reducing the overall apparatus operation downtime, and improving substrate processing throughput.

Means for Solving the Problem

According to one embodiment of the present invention, a substrate processing apparatus includes a plurality of vacuum transfer modules including transfer mechanisms for transferring a substrate between a plurality of process modules that are configured to process the substrate under a reduced-pressure atmosphere, the process modules being arranged near the vacuum transfer modules; one or more load lock modules provided at each vacuum transfer module of the plurality of vacuum transfer modules, the load lock modules being configured to switch an internal atmosphere between an air atmosphere and a reduced-pressure atmosphere and pass the substrate to and from the vacuum transfer modules; a first atmosphere transfer mechanism that transfers the substrate that is fed from outside to one of the load lock modules; and a second atmosphere transfer mechanism that receives the substrate from the first atmosphere transfer mechanism and transfers the received substrate to another one of the load lock modules. The second atmosphere transfer mechanism is arranged above or below the vacuum transfer module that is provided with the one of the load lock modules, and the plurality of vacuum transfer modules are arranged in series along a substrate transfer direction of the second atmosphere transfer mechanism.

Effects of the Invention

According to an aspect of the present invention, the space occupied by the substrate processing apparatus may be reduced, the overall apparatus downtime may be reduced, and the substrate processing throughput may be improved.

BRIEF DESCRIPTION OF THE DRAWINGS

FIG. 6 is a schematic sectional side view illustrating an exemplary configuration of a substrate processing apparatus according to a third modification.

EMBODIMENTS FOR IMPLEMENTING THE INVENTION

In the following, embodiments of the present invention are described with reference to the accompanying drawings.

Figure 1:
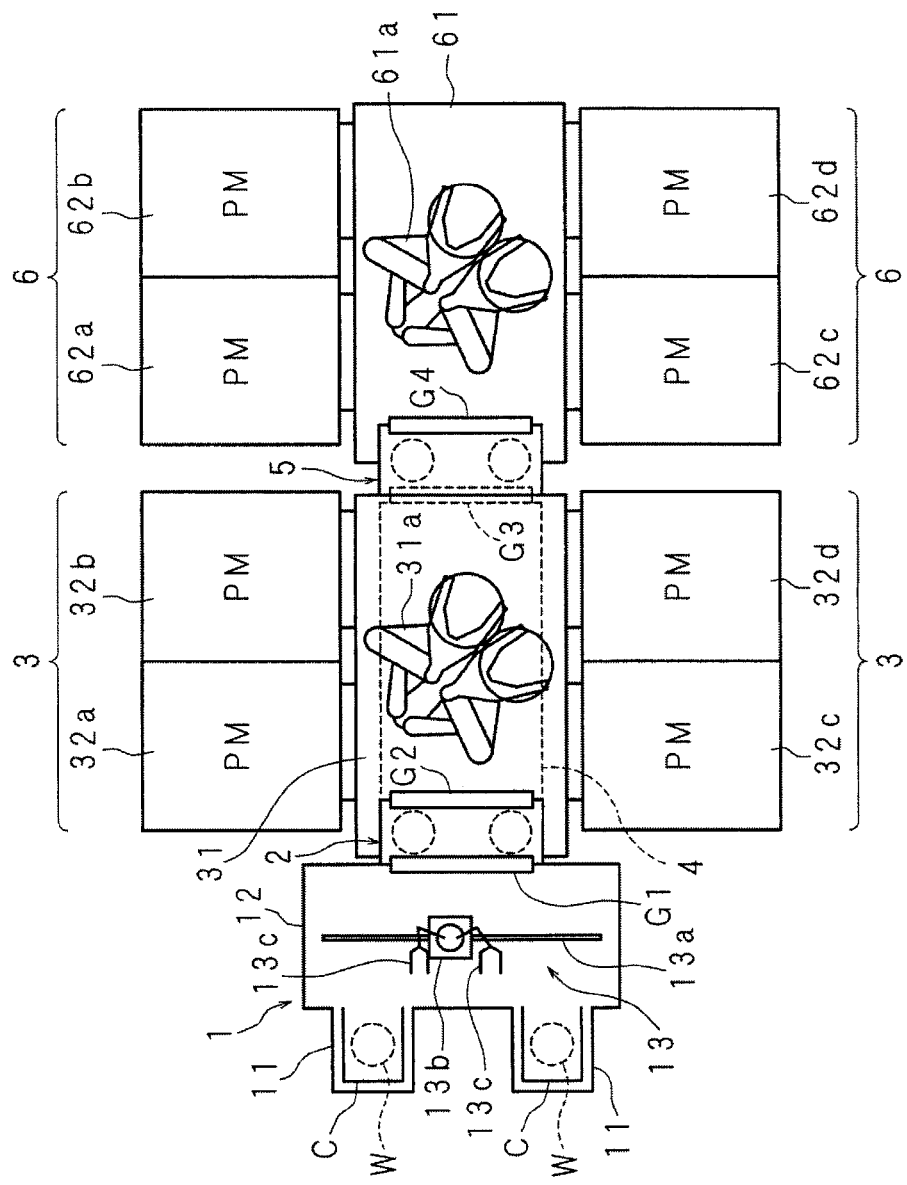
FIG. 1 is a schematic plan view illustrating an exemplary configuration of a substrate processing apparatus according to an embodiment of the present invention.
Figure 2:
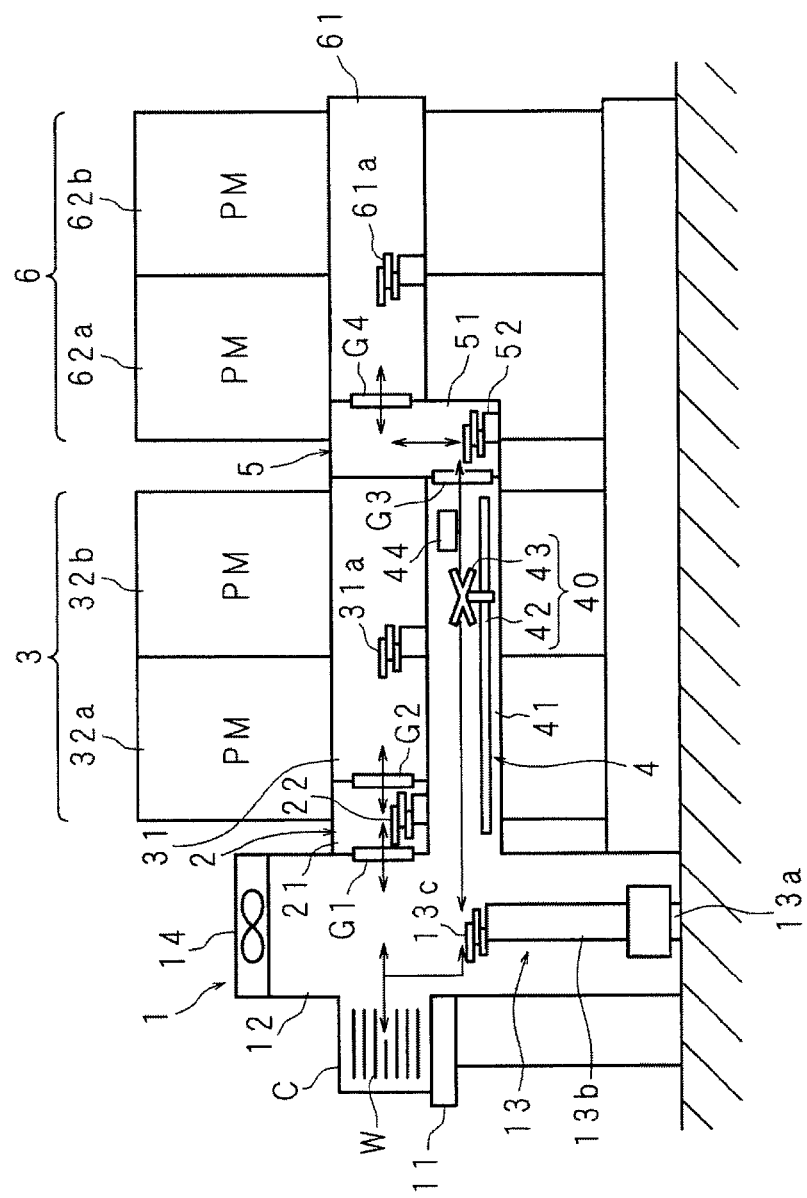
FIG. 2 is a schematic sectional side view of the substrate processing apparatus.

FIG. 1 is a schematic plan view illustrating an exemplary configuration of a substrate processing apparatus according to an embodiment of the present invention. FIG. 2 is a schematic sectional side view of the substrate processing apparatus. FIGS. 3A-3E schematically illustrate operations of a second atmosphere transfer mechanism 40 and a second load lock device 5 of the substrate processing apparatus. The substrate processing apparatus of the present embodiment includes a first atmosphere transfer device 1, a first load lock device 2, a first cluster 3, a second atmosphere transfer device 4, a second load lock device 5, and a second cluster 6.

The first atmosphere transfer device 1 includes a first atmosphere transfer module 12 that is arranged into a laterally long substantially cuboid shape. A load port 11 is arranged at a side wall of a long side of the first atmosphere transfer module 12. A wafer W is passed between the load port 11 and a conveyor (not shown) that runs outside the substrate processing apparatus. The conveyor (not shown) transfers a cassette C that accommodates plural unprocessed wafers W to the substrate processing apparatus. The load port 11 includes a stage on which the cassette C accommodating the wafers W is placed and a mechanism for opening and closing the cassette C and connecting the cassette C to the first atmosphere transfer module 12. On the other side wall of the first atmosphere transfer module 12 opposing the side wall with the load port 11, the first cluster 3 is connected via the first load lock device 2, and the second cluster 6 is connected via the second atmosphere transfer device 4 and the second load lock device 5. A first atmosphere transfer mechanism 13 is arranged at a bottom part of the first atmosphere transfer module 12. The first atmosphere transfer mechanism 13 removes a wafer W from the cassette C that is placed on the load port 11 and transfers the removed wafer W to the first load lock device 2 and the second atmosphere transfer device 4. The first atmosphere transfer mechanism 13 includes a guide rail 13a that extends in the longitudinal direction at the bottom part of the first atmosphere transfer module 12, and an atmosphere robot 13b that is configured to be movable along the guide rail 13a. The atmosphere robot 13b includes a plurality of expandable multi-joint arms equipped with forks for holding and transferring the wafer W. Also, a drive mechanism (not shown) is provided as an elevation mechanism for raising and lowering the multi-joint arms and turning the multi-joint aims. The atmosphere robot 13b may be moved along the guide rail 13a by a linear motor, for example, and the multi-joint arms may be raised, lowered, and turned to remove the wafer W from the cassette C that is placed on the load port 11. Then, the removed wafer W may be transferred to the first load lock device 2 and the second atmosphere transfer device 4. The atmosphere robot 13b may also receive a wafer W that has been processed at the first cluster 3 and the second cluster 6 from the first load lock device 2 and the second atmosphere transfer device 4, and return the processed wafer W back to the cassette C.

Referring to FIG. 2, a first blower unit 14 that blows cleaning gas to the first atmosphere transfer module 12 is arranged at a suitable location of the first atmosphere transfer module 12.

The first load lock device 2 includes a first load lock module 21 that is connected to a vacuum pump. The atmosphere within the first load lock module 21 may be switched between air atmosphere and reduced-pressure atmosphere by vacuuming the first load lock module 21 or opening up the first load lock module 21 to the atmosphere. Gate G1 and gate G2, which may be opened/closed, are respectively arranged at the first atmosphere transfer device 1 side and the first cluster 3 side of the first load lock module 21. A first transfer robot 22 is arranged at the bottom part of the first load lock module 21. The first transfer robot 22 transfers a wafer W between the first atmosphere transfer module 12 and the first cluster 3 via the gates G1 and G2. The first transfer robot 22 is a vacuum robot that includes a multi-joint arm equipped with a fork for holding the wafer W.

In the case of transferring a wafer W from the first atmosphere transfer module 12 to the first cluster 3, the first load lock module 21 is adjusted to air atmosphere, the gate G1 is opened, and the first transfer robot 22 transfers the wafer W from the first atmosphere transfer module 12 to the first load lock module 21 via the gate G1 after which the gate G1 is closed. Then, the first load lock module 21 is vacuumed to reduced-pressure atmosphere and the gate G2 is opened. The first transfer robot 22 transfers the wafer W to a first vacuum transfer module 31 (described below) of the first cluster 3 via the gate G2. In the case of transferring the wafer W from the first cluster 3 to the first atmosphere transfer module 12, the above steps for transferring the wafer W are performed in reverse order.

Note that although an exemplary case of transferring the wafer W using the first transfer robot 22 is described above, in alternative embodiments, a stage that moves up and down may be used instead of the first transfer robot 22, for example. In this case, the first atmosphere transfer mechanism 13 and a first vacuum transfer mechanism 31a may place the wafer W on this stage to transfer the wafer W.

The first cluster 3 includes a first vacuum transfer module 31 that is arranged into a laterally long substantially cuboid shape. The longitudinal direction of the first vacuum transfer module 31 is arranged to be substantially perpendicular to the transfer direction of the first atmosphere transfer mechanism 13. The gate G2 is connected to a side wall of a short side of the first vacuum transfer module 31. In the example illustrated in FIG. 1, four first vacuum process modules (PM) 32a, 32b, 32c, and 32d are connected to side walls of the long sides of the first vacuum transfer module 31 via gate valves, which may be opened/closed. Note that although four process modules are provided in the illustrated example, any number of process modules may be provided in a cluster. The first vacuum process modules 32a, 32b, 32c, and 32d are each configured to perform predetermined substrate processes on a semiconductor wafer W under a reduced-pressure atmosphere. For example, the first vacuum process modules 32a, 32b, 32c, and 32d may be configured to perform film formation, etching, oxide diffusion, annealing, or modification on the wafer W. The first vacuum transfer mechanism 31a is arranged at a bottom part of the first vacuum transfer module 31. The first vacuum transfer mechanism 31a introduces a wafer W into the first vacuum transfer module 31 via the gate G2 and transfers the wafer W to the first vacuum process modules 32a, 32b, 32c, and 32d according to a recipe. The first vacuum transfer mechanism 31a is a vacuum robot that includes two multi-joint arms equipped with forks for holding the wafer W. When substrate processes performed by the vacuum process modules are completed, the first vacuum transfer mechanism 31a transfers the processed wafer W to the first load lock module 21 via the gate G2.

The second atmosphere transfer device 4 includes a second atmosphere transfer module 41 that is arranged into a laterally long substantially cuboid shape and is arranged at the lower side of the first vacuum transfer module 31. The longitudinal direction of the second atmosphere transfer module 41 is arranged to be substantially perpendicular to the transfer direction of the first atmosphere transfer device 1. A second atmosphere transfer mechanism 40 is arranged at a bottom part of the second atmosphere transfer module 41. The second atmosphere transfer mechanism 40 is configured to receive a substrate from the first atmosphere transfer mechanism 13 and transfer the received substrate to the second load lock device 5. The second atmosphere transfer mechanism 40 includes a guide rail 42 that is arranged to extend in a longitudinal direction at the bottom part of the second atmosphere transfer module 41. An X-shaped wafer holding member 43 is arranged to be movable along the guide rail 42. The wafer holding member 43 is configured to hold a wafer W that is transferred from the first atmosphere transfer device 1 and transfer the wafer W to the second load lock device 5. The wafer holding member 43 may be driven by a linear motor, for example, to move along the guide rail 42. Also, a second blower unit 44 that blows cleaning air to the second atmosphere transfer module 41 is arranged at a suitable location of the second atmosphere transfer module 41.

Figure 3A:
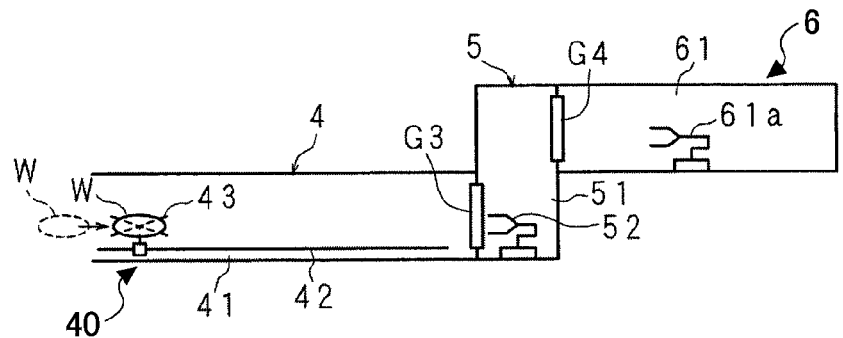
FIG. 3A schematically illustrates operations of a second atmosphere transfer mechanism and a second load lock device of the substrate processing apparatus.
Figure 3B:
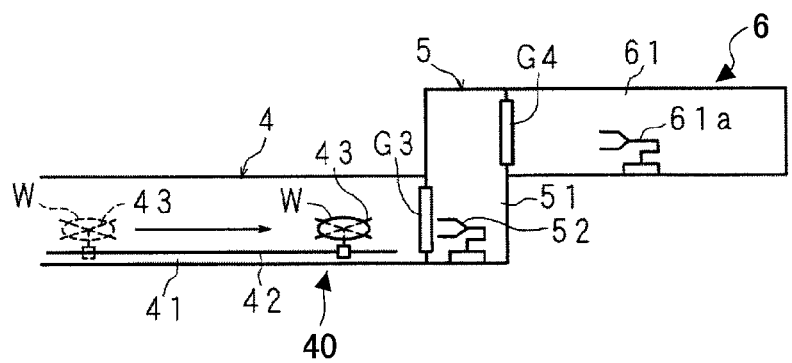
FIG. 3B schematically illustrates operations of the second atmosphere transfer mechanism and the second load lock device of the substrate processing apparatus.

In the case of transferring a wafer W from the first atmosphere transfer device 1 to the second load lock device 5, the second atmosphere transfer mechanism 40 moves the wafer holding member 43 toward the first atmosphere transfer device 1 side. As illustrated in FIG. 3A, the first atmosphere transfer mechanism 13 (see FIG. 1) passes the wafer W to the wafer holding member 43. As illustrated in FIG. 3B, the wafer holding member 43 holding the wafer W moves along the guide rail 42 toward the second load lock device 5. The wafer W held by the wafer holding member 43 is received by a second transfer robot 52 (described below) that is arranged at the second load lock device 5.

In the case of transferring the wafer W from the second load lock device 5 to the first atmosphere transfer device 1, the above steps for transferring the wafer W may be performed in reverse order.

Like the first load lock device 2, the second load lock device 5 includes a second load lock module 51 that is arranged into a vertically long substantially cuboid shape and is connected to a vacuum pump. The atmosphere within the second load lock module 51 may be switched between air atmosphere and reduced-pressure atmosphere by vacuuming the second load lock module 51 or opening up the second load lock module 51 to the atmosphere. Gate G3 and gate G4, which may be opened/closed, are respectively arranged at a lower side wall of the second load lock module 51 toward the second atmosphere transfer device 4 and an upper side wall of the second load lock module 51 toward the second cluster 6. The second transfer robot 52, which transfers the wafer W between the second atmosphere transfer module 41 and the second cluster 6 via gate G3 and gate G4, is arranged at a bottom part of the second load lock module 51. The second transfer robot 52 is a vacuum robot that includes a multi-joint arm equipped with a fork for holding the wafer W. The second transfer robot 52 also includes a drive mechanism (not shown) as an elevating mechanism for raising and lowering the multi-joint arm and turning the multi-joint arm.

Figure 3C:
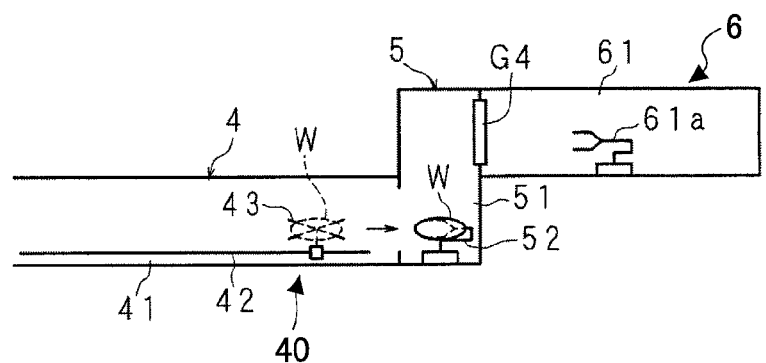
FIG. 3C schematically illustrates operations of the second atmosphere transfer mechanism and the second load lock device.
Figure 3D:
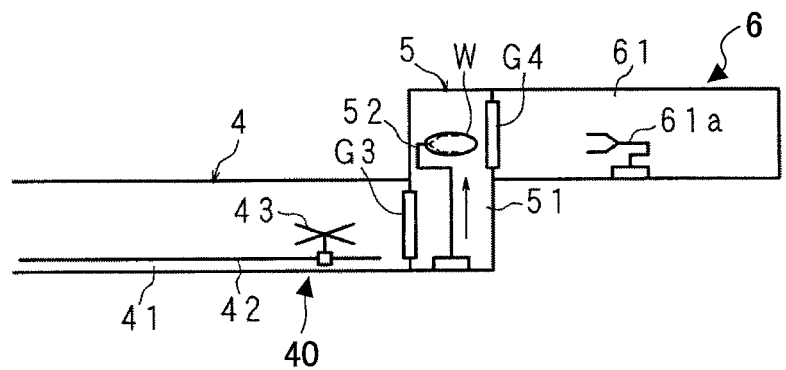
FIG. 3D schematically illustrates operations of the second atmosphere transfer mechanism and the second load lock device.
Figure 3E:
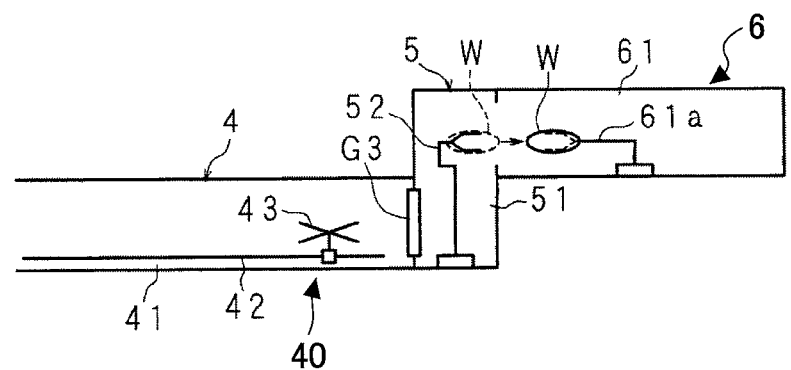
FIG. 3E schematically illustrates operations of the second atmosphere transfer mechanism and the second load lock device.

In the case of transferring the wafer W from the second atmosphere transfer module 41 to the second cluster 6, as illustrated in FIG. 3C, the second load lock module 51 is adjusted to air atmosphere, the gate G3 is opened, and the second transfer robot 52 transfers the wafer W from the second atmosphere transfer module 41 to the second load lock module 51 via the gate G3 after which the gate G1 is closed. Then, the second load lock module 51 is vacuumed to reduced-pressure atmosphere. Then, as illustrated in FIG. 3D, the second transfer robot 52 raises the wafer W and the gate G4 is opened. As illustrated in FIG. 3E, the second transfer robot 52 then transfers the wafer W to a second vacuum transfer module 61 (described below) of the second cluster 6 via the gate G4. In the case of transferring the wafer W from the second cluster 6 to the second atmosphere transfer module 41, the above steps for transferring the wafer W are performed in reverse order.

Note that although an exemplary case of transferring the wafer W using the second transfer robot 52 is described above, in alternative embodiments, a stage that moves up and down may be used instead of the second transfer robot 52, for example. In this case, the second atmosphere transfer mechanism 40 and a second vacuum transfer mechanism 61a may place the wafer W on this stage and move the stage up and down to transfer the wafer W.

Like the first cluster 3, the second cluster 6 includes a second vacuum transfer module 61 that is arranged into a laterally long substantially cuboid shape. A longitudinal direction of the second vacuum transfer module 61 is arranged to substantially coincide with the transfer direction of the first vacuum transfer module 31 so that the second vacuum transfer module 61 and the first vacuum transfer module 31 are arranged in series. That is, the first vacuum transfer module 31 and the second vacuum transfer module 61 are arranged in series along the wafer transfer direction of the second atmosphere transfer mechanism 40. Also, the first vacuum transfer module 31 and the second vacuum transfer module 61 are arranged to have substantially the same height in the vertical direction. The gate G4 is connected to a side wall of a short side of the second vacuum transfer module 61. Four second vacuum process modules (PM) 62a, 62b, 62c, and 62d are connected to side walls of the long sides of the second vacuum transfer module 61 via gate valves, which may be opened/closed (see FIG. 1). The second vacuum process modules 62a, 62b, 62c, and 62d are each configured to perform predetermined substrate processes on a semiconductor wafer W under a reduced-pressure atmosphere. The second vacuum transfer mechanism 61a that introduces a wafer W into the second vacuum transfer module 61 via the gate G4 and transfers the wafer W to the second vacuum process modules 62a, 62b, 62c, and 62d according to a recipe is arranged below the second vacuum process modules 62a, 62b, 62c, and 62d. The second vacuum transfer mechanism 61a is a vacuum robot that includes two multi-joint arms equipped with forks for holding the wafer W. When substrate processes performed by the second vacuum process modules 62a, 62b, 62c, and 62d are completed, the second vacuum transfer mechanism 61a transfers the processed wafer W to the second load lock module 51 via the gate G4.

In the substrate processing apparatus of the present embodiment having the above configuration, the first cluster 3 and the second cluster 6 are arranged in series along the transfer direction of the second atmosphere transfer device 4 on both sides of opposing side walls of the second atmosphere transfer module 41. By arranging the second atmosphere transfer device 4 below the first vacuum transfer device 31, the space occupied by the substrate processing apparatus may be reduced compared to a case where the clusters are arranged in parallel along the transfer direction of the second atmosphere transfer device 4.

Also, the substrate processing throughput may be improved by implementing the second atmosphere transfer device 4.

The second atmosphere transfer device 4 includes a buffer-like function. The second atmosphere transfer device 4 may act as a bypass route to the second cluster 6. For example, while operations for transferring the wafer W are idle, a wafer W may be transferred from the first atmosphere transfer device 1 to the second atmosphere transfer device 4, and the wafer W may be positioned in front of the second load lock device 5. In this way, when the first atmosphere transfer device 1 has to transfer a wafer W to/from the first cluster 3, the first atmosphere transfer device 1 may dedicate its operations to transferring the wafer W to/from the first cluster 3, and operations for transferring a wafer W to/from the second cluster 6 may be delegated to the second atmosphere transfer mechanism 40. The second atmosphere transfer device 4 may exchange a wafer W that is processed and a wafer W that is not yet processed with the second cluster 6 and pass the processed wafer W to the first atmosphere transfer device 1 at a suitable timing.

Further, in the present embodiment, the first cluster 3 and the second cluster 6 are not serially connected to each other and include independent mechanisms in terms of hardware. Thus, even when one of the first cluster 3 or the second cluster 6 fails, the other one of the first cluster 3 or the second cluster 6 may continue substrate processing operations. In this way, the overall apparatus operation downtime may be reduced. Also, operations of one of the first cluster 3 or the second cluster 6 may be stopped individually to perform maintenance and inspection on one of the first cluster 3 or the second cluster 6.

Further, by providing the first blower unit 14 and the second blower unit 44, clean environments may be maintained within the first atmosphere transfer module 12 and the second atmosphere transfer module 41.

Note that although the above example describes a sheet-feed process in which the wafer W is removed from the cassette C one at a time, in alternative embodiments, the first atmosphere transfer mechanism 13, the second atmosphere transfer mechanism 40, the first vacuum transfer mechanism 31a, the second vacuum transfer mechanism 61a, and the respective wafer holding members of the first load lock device 2 and the second load lock device 5 may be configured to hold plural wafers W.

Also, although the first atmosphere transfer module 12 and the second atmosphere transfer module 41 are arranged into substantially cuboid shapes that communicate with each other in the above illustrated example, the first atmosphere transfer module 12 and the second atmosphere transfer module 41 may be arranged to have other configurations so long as they form spaces for accommodating the first atmosphere transfer mechanism 13 and the second atmosphere transfer mechanism 40, respectively. For example, the first atmosphere transfer module 12 and the second atmosphere transfer module 41 do not necessarily have to include wall members that surround their respective transfer mechanisms.

(First Modification)

A substrate processing apparatus according to a first modification differs from the above embodiment in that a second atmosphere transfer device 104 is arranged above the first vacuum transfer device 31. In the following, features of the substrate processing apparatus according to the first modification that differs from the above embodiment are described.

Figure 4:
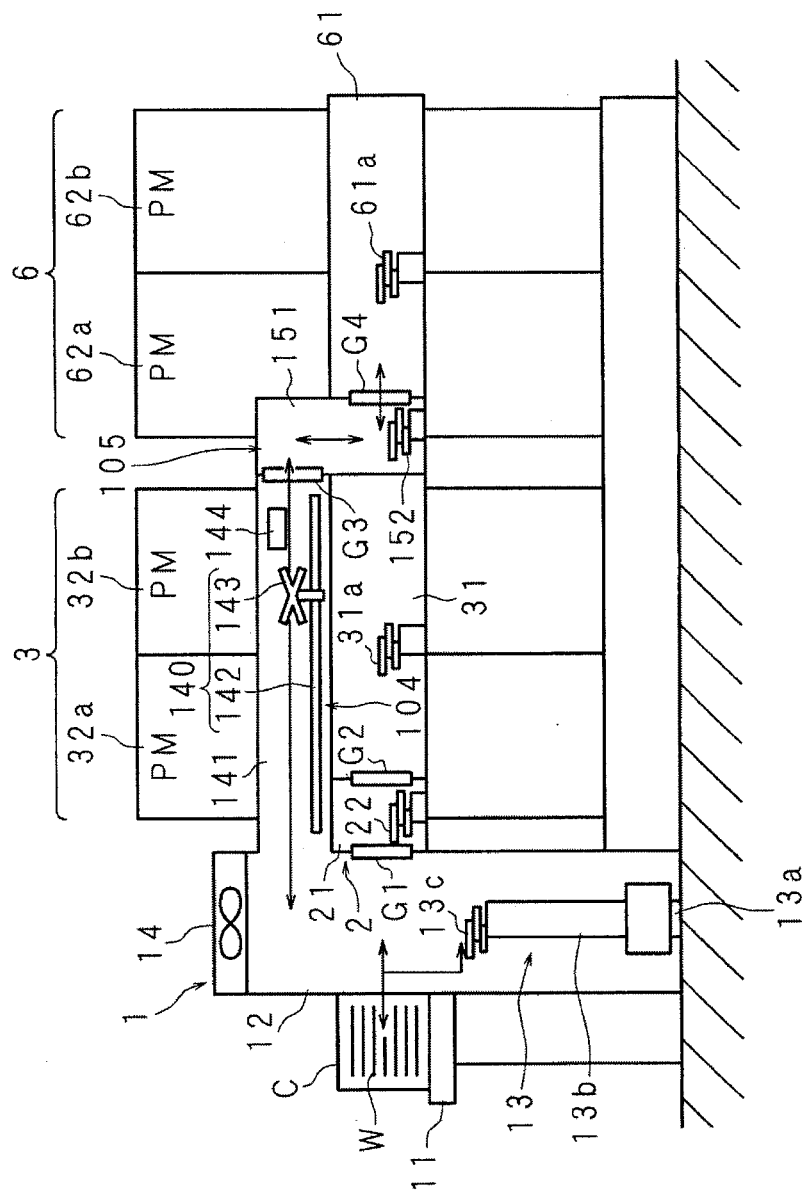
FIG. 4 is a schematic sectional side view illustrating an exemplary configuration of a substrate processing apparatus according to a first modification.

FIG. 4 is a schematic sectional side view illustrating an exemplary configuration of the substrate processing apparatus according to the first modification. The substrate processing apparatus according to the first modification includes the first atmosphere transfer device 1, the first load lock device 2, the first cluster 3, the second atmosphere transfer device 104, a second load lock device 105, and the second cluster 6.

The second atmosphere transfer device 104 includes a second atmosphere transfer module 141 that is arranged above the first vacuum transfer module 31. As in the above embodiment, a second atmosphere transfer mechanism 140 including a guide rail 142 and a wafer holding member 143, and a second blower unit 144, are arranged within the second atmosphere transfer module 141.

The load lock device 105 includes a second load lock module 151 and a second transfer robot 152. Like the above embodiment, the gate G3 and the gate G4, which may be opened/closed, are respectively arranged at an upper side wall of the second load lock module 151 toward the second atmosphere transfer device 104 and a lower side wall of the second load lock module 151 toward the second cluster 6.

In the substrate processing apparatus according to the first modification, the first cluster 3 and the second cluster 6 are arranged in series along the transfer direction of the second atmosphere transfer device 4 on both side walls of the second atmosphere transfer module 141 as in the above embodiment, and the second atmosphere transfer device 4 is arranged above the first vacuum transfer module 31. In this way, the space occupied by the substrate processing apparatus may be reduced. Also, as in the above embodiment, the first cluster 3 and the second cluster 6 are not serially connected to each other so that even when one of the first cluster 3 or the second cluster 6 fails, the other one of the first cluster 3 or the second cluster 6 may continue substrate processing operations. In this way, the overall apparatus operation downtime may be reduced and the substrate processing throughput may be improved.

(Second Modification)

A substrate processing apparatus according to a second modification differs from the above embodiment in that it includes an extra atmosphere transfer device. That is, the substrate processing apparatus according to the second modification includes the second atmosphere transfer device 4 and a third atmosphere transfer device 204. In the following, features of substrate processing apparatus according to the second modification that differ from the above embodiment are described.

Figure 5:
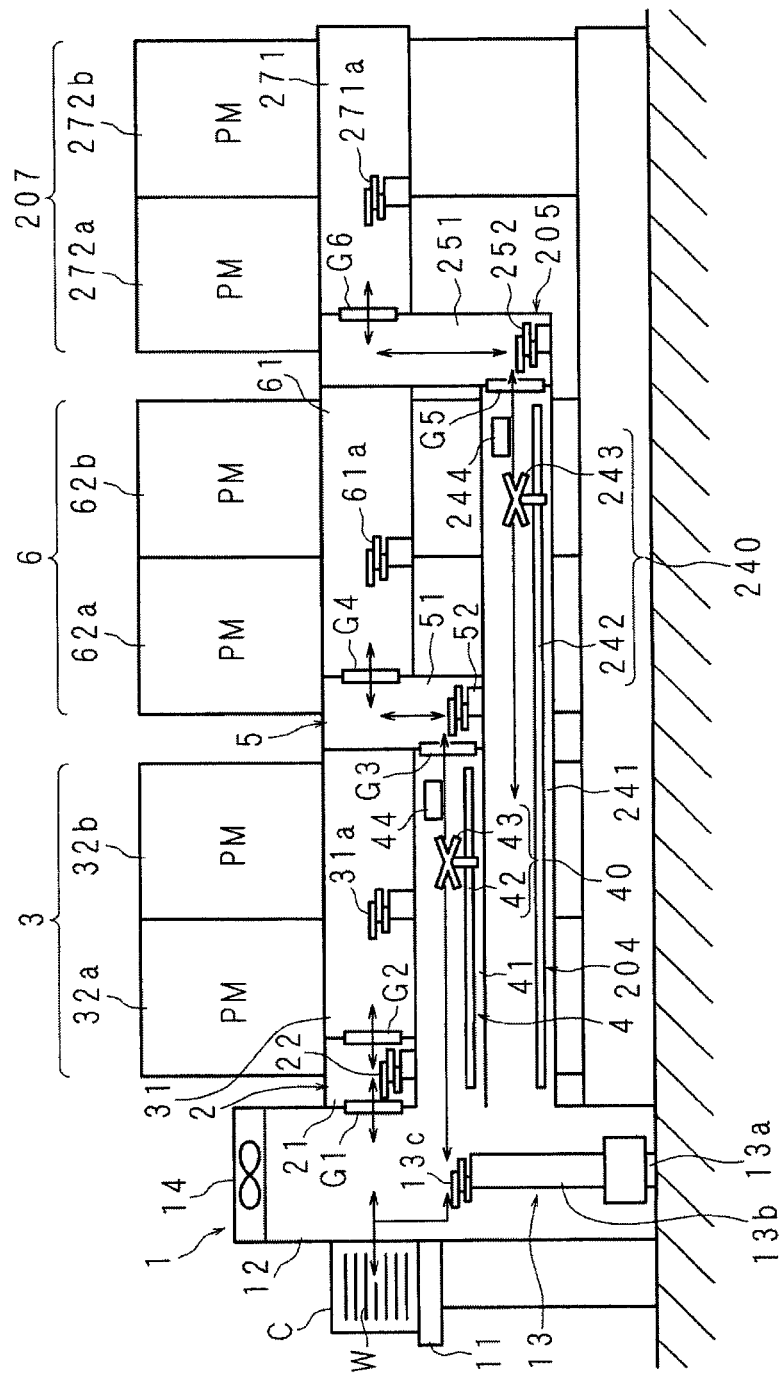
FIG. 5 is a schematic sectional side view illustrating an exemplary configuration of a substrate processing apparatus according to a second modification.

FIG. 5 is a schematic sectional side view illustrating an exemplary configuration of the substrate processing apparatus according to the second modification. The substrate processing apparatus according to the second modification includes the first atmosphere transfer device 1, the first load lock device 2, the first cluster 3, the second atmosphere transfer device 4, the second load lock device 5, the second cluster 6, the third atmosphere transfer device 204, a third load lock device 205, and a third cluster 207.

The third atmosphere transfer device 204 has a configuration similar to that of the second atmosphere transfer device 2 and includes a third atmosphere transfer module 241 that is arranged below the second atmosphere transfer module 41. A third atmosphere transfer mechanism 240 including a guide rail 242 and a wafer holding member 243, and a third blower unit 244 are arranged within the third atmosphere transfer module 241.

The third load lock device 205 has a configuration similar to that of the second load lock device 5 and includes a third load lock module 251 and a third transfer robot 252. Gate G5 and gate G6, which may be opened/closed, are respectively arranged at a lower side wall of third load lock module 251 toward the third atmosphere transfer device 204 and an upper side wall of the third load lock module 251 toward the third cluster 207.

Like the first cluster 3, the third cluster 207 includes a third vacuum transfer module 271 that is arranged into a laterally long cuboid shape. The longitudinal direction of the third vacuum transfer module 271 is arranged to substantially coincide with the longitudinal directions of the first vacuum transfer module 31 and the second vacuum transfer module 61 so that the first vacuum transfer module 31, the second vacuum transfer module 61, and the third vacuum transfer module 271 are arranged in series. That is, the first vacuum transfer module 31, the second vacuum transfer module 61, and the third vacuum transfer module 271 are arranged in series along the wafer transfer direction of the third atmosphere transfer mechanism 240. Also, the first vacuum transfer module 31, the second vacuum transfer module 61, and the third vacuum transfer module 271 are arranged to have substantially the same height in the vertical direction. The gate G6 is connected to a side wall of a short side of the third vacuum transfer module 271. A plurality of third vacuum process modules 272a and 272b are connected to side walls of the long sides of the third vacuum transfer module 271 via gate valves, which may be opened/closed.

According to an aspect of the second modification, by connecting the three clusters; namely, the first cluster 3, the second cluster 6, and the third cluster 207, in series, the space occupied by the substrate processing apparatus may be prevented from increasing, the overall apparatus operation downtime may be reduced, and the substrate processing throughput may be improved.

Also, in the second modification, the second atmosphere transfer mechanism 40 and the third atmosphere transfer mechanism 240 are arranged to overlap with one another in planar view. In this way, the space occupied by the substrate processing apparatus may be reduced compared to a case where the atmosphere transfer mechanisms are arranged in parallel in the horizontal direction.

(Third Modification)

FIG. 6 is a schematic sectional side view illustrating an exemplary configuration of a substrate processing apparatus according to a third modification. In the substrate processing apparatus according to the third modification, a first vacuum transfer module 331 and the second load lock device 5 have configurations that differ from the above embodiment. In the following, features of the substrate processing apparatus according to the third modification that differ from the above embodiment are described. The substrate processing apparatus according to the third modification includes a first vacuum transfer module 331 and the second load lock module 51 that communicate with each other, and a gate valve G7 that is arranged between the first vacuum transfer module 331 and the second load lock module 51. The first vacuum transfer mechanism 31a and the second transfer robot 52 are configured to transfer a wafer W via a communication opening of the first vacuum transfer module 331 and the second load lock module 51.

In the third modification, a wafer W that is processed at the first cluster 3 may be transferred from the first vacuum transfer module 331 to the second vacuum transfer module 61 via the second load lock module 51 so that the wafer W may be processed at the second cluster 6 corresponding to the downstream cluster.

Also, in a case where a wafer cannot be passed by the first load lock device 2 because another wafer W is already in the first load lock device 2, or in the case where maintenance operations are being conducted on the first load lock device 2, the wafer W may be transferred to the first vacuum transfer module 331 via the first atmosphere transfer module 12, the second atmosphere transfer module 41, and the second load lock module 51 so that the wafer W may be processed at the first cluster 3. Similarly, in the case of discharging the wafer W out of the first vacuum transfer module 331, the wafer W may be transferred from the first vacuum transfer module 331 to the outside via the second load lock module 51, the second atmosphere transfer module 41, and the first atmosphere transfer module 12.

In the following, features and advantageous effects of embodiments of the present invention are summarized. A substrate processing apparatus according to an embodiment of the present invention includes a plurality of vacuum transfer modules including transfer mechanisms for transferring a substrate between a plurality of process modules that are configured to process the substrate under a reduced-pressure atmosphere, the process modules being arranged near the vacuum transfer modules; one or more load lock modules provided at each vacuum transfer module of the plurality of vacuum transfer modules, the load lock modules being configured to switch an internal atmosphere between an air atmosphere and a reduced-pressure atmosphere and pass the substrate to and from the vacuum transfer modules; a first atmosphere transfer mechanism that transfers the substrate that is fed from outside to one of the load lock modules; and a second atmosphere transfer mechanism that receives the substrate from the first atmosphere transfer mechanism and transfers the received substrate to another one of the load lock modules. The second atmosphere transfer mechanism is arranged above or below the vacuum transfer module that is provided with the one of the load lock modules, and the plurality of vacuum transfer modules are arranged in series along a substrate transfer direction of the second atmosphere transfer mechanism.

In the present embodiment, a substrate fed to the first atmosphere transfer mechanism from outside may be transferred to one of the load lock module, and the substrate may be introduced into a vacuum transfer module via this load lock module. The substrate introduced into the vacuum transfer module undergoes various substrate processes at the process modules arranged near this vacuum transfer module. Then, the substrate may follow the same transfer route in reverse order to be discharged outside. On the other hand, the first atmosphere transfer mechanism may also hand over the substrate to the second atmosphere transfer mechanism. The second atmosphere transfer mechanism receives the substrate from the first atmosphere transfer mechanism and transfers the received substrate to another one of the load lock module. The substrate is then introduced into a vacuum transfer module via the other one of the load lock modules. The substrate introduced into the vacuum transfer module undergoes various substrate processes at the process modules arranged near this vacuum transfer module. The substrate then follows the same transfer route in reverse order to be discharged outside.

According to an aspect of the present embodiment, the substrate processing throughput may not be degraded as a result of passing the substrate between the vacuum transfer modules.

Also, because the first atmosphere transfer mechanism is configured to pass the substrate to the other one of the load lock modules via the second atmosphere transfer mechanism, the second atmosphere transfer mechanism may act like a buffer. For example, in a situation where plural load lock modules are required to pass substrates, by having the second atmosphere transfer mechanism receive the substrate from the first atmosphere transfer mechanism beforehand, the first atmosphere transfer mechanism may perform operations for transferring a substrate between the one of the load lock modules while the second atmosphere transfer mechanism may perform operations for transferring a substrate between the other one of the load lock modules. In this way, the overall apparatus throughput may be prevented from decreasing.

Further, because the vacuum transfer modules are not serially connected, their independence may be maintained and failure of one of the vacuum transfer modules may be prevented from interfering with operations of another one of the vacuum transfer modules.

Further, because the second atmosphere transfer mechanism is arranged below or above a process module, the space occupied by the substrate processing apparatus may be reduced.

Further, because the plurality of vacuum transfer modules are arranged in series along the substrate transfer direction of the second atmosphere transfer mechanism, the space occupied by the substrate processing apparatus may be reduced compared to a case where the plurality of vacuum transfer modules are arranged in parallel along the substrate transfer direction of the second atmosphere transfer mechanism.

In a further embodiment of the present invention, the plurality of vacuum transfer modules are arranged in series along the substrate transfer direction of the second atmosphere transfer mechanism on both sides of opposing side walls of the second atmosphere transfer mechanism.

In a further embodiment of the present invention, the other one of the load lock modules includes a first opening part for transferring the substrate to/from the second atmosphere transfer mechanism; a second opening part for transferring the substrate to/from the vacuum transfer module that is provided with the other one of the load lock modules; an elevating mechanism for raising and lowering the substrate; and a transfer robot that transfers the substrate via the first opening part and the second opening part.

According to an aspect of the present embodiment, even when the wafer transfer path of the second atmosphere transfer mechanism and the wafer transfer path of the vacuum transfer modules are arranged at different heights in the vertical direction, the transfer robot may raise and lower the substrate to transfer the substrate between the second atmosphere transfer mechanism and the vacuum transfer modules.

In a further embodiment of the present invention, the plurality of vacuum transfer modules are arranged to have substantially the same height in a vertical direction with respect to an installation face of the substrate processing apparatus. In this way, the vacuum transfer modules may be operated under substantially the same environment.

In a further embodiment of the present invention, the second atmosphere transfer mechanism is accommodated within an atmosphere transfer module; and the atmosphere transfer module includes a blower unit that blows cleaning air.

According to an aspect of the present embodiment, cleaning air may be blown into the atmosphere transfer module accommodating the second atmosphere transfer mechanism.

In a further embodiment of the present invention, the second atmosphere transfer mechanism includes a plurality of atmosphere transfer mechanisms that overlap with one another in planar view.

According to an aspect of the present embedment, because the plurality of atmosphere transfer mechanisms of the second atmosphere transfer mechanism are arranged to overlap one another in planar view, the space occupied by the substrate processing apparatus may be reduced compared to a case where the plurality of atmosphere transfer mechanisms of the second atmosphere transfer mechanism are arranged in parallel in the horizontal direction.

Although certain preferred embodiments of the present invention have been described above with reference to the accompanying drawings, these embodiments are illustrative only and not restrictive of the invention as claimed. The scope of the present invention is defined by the claims, and it is to be understood that the present invention encompasses all variations and modifications within the scope of the claims and all equivalents thereof. That is, those skilled in the art may conceive numerous variations and modifications based on the technical concept defined by the claims, and such variations and modifications are all within the scope of the present invention.

The present application is based on and claims the benefit of priority of Japanese Patent Application No. 2011-069016 filed on Mar. 26, 2011, the entire contents of which are herein incorporated by reference.

DESCRIPTION OF THE REFERENCE NUMERALS 1 first atmosphere transfer device
2 first load lock device
3 first cluster
4 second atmosphere transfer device
5 second load lock device
6 second cluster
11 load port
12 first atmosphere transfer module
13 first atmosphere transfer mechanism
13a guide rail
13b atmosphere robot
14 first blower unit
21 first load lock module
22 first transfer robot
31 first vacuum transfer module
31a first vacuum transfer mechanism
41 second atmosphere transfer module
42 guide rail 43 wafer holding member
44 second blower unit
51 second load lock module
52 second transfer robot
61 second vacuum transfer module
61a second vacuum transfer mechanism
W wafer

The invention claimed is:

1. A substrate processing apparatus comprising:

a plurality of vacuum transfer modules including transfer mechanisms for transferring a substrate between a plurality of process modules that are configured to process the substrate under a reduced-pressure atmosphere, the process modules being arranged near the vacuum transfer modules;

one or more load lock modules provided at each vacuum transfer module of the plurality of vacuum transfer modules, the load lock modules being configured to switch an internal atmosphere between an air atmosphere and a reduced-pressure atmosphere and pass the substrate to and from the vacuum transfer modules;

a first atmosphere transfer mechanism that transfers the substrate that is fed from outside to one of the load lock modules; and a second atmosphere transfer mechanism that receives the substrate from the first atmosphere transfer mechanism and transfers the received substrate to another one of the load lock modules;

wherein the second atmosphere transfer mechanism is arranged above or below the vacuum transfer module that is provided with the one of the load lock modules; and wherein the plurality of vacuum transfer modules are arranged in series along a substrate transfer direction of the second atmosphere transfer mechanism.

2. The substrate processing apparatus as claimed in claim 1, wherein the plurality of vacuum transfer modules are arranged in series along the substrate transfer direction of the second atmosphere transfer mechanism on both sides of opposing side walls of the second atmosphere transfer mechanism.

3. The substrate processing apparatus as claimed in claim 1, wherein the other one of the load lock modules includes a first opening part for transferring the substrate to/from the second atmosphere transfer mechanism; a second opening part for transferring the substrate to/from the vacuum transfer module that is provided with the other one of the load lock modules; an elevating mechanism for raising and lowering the substrate;

and a transfer robot that transfers the substrate via the first opening part and the second opening part.

4. The substrate processing apparatus as claimed in claim 3, wherein the plurality of vacuum transfer modules are arranged to have substantially the same height in a vertical direction with respect to an installation face of the substrate processing apparatus.

5. The substrate processing apparatus as claimed in claim 1, wherein the second atmosphere transfer mechanism is accommodated within an atmosphere transfer module; and the atmosphere transfer module includes a blower unit that blows cleaning air.

6. The substrate processing apparatus as claimed in claim 1, wherein the second atmosphere transfer mechanism includes a plurality of atmosphere transfer mechanisms that overlap with one another in planar view.

* * * * *